(12) United States Patent
Trezza

(10) Patent No.: US 7,850,060 B2
(45) Date of Patent: Dec. 14, 2010

(54) HEAT CYCLE-ABLE CONNECTION

(76) Inventor: John Trezza, 12 White Oak Dr., Nashua, NH (US) 03063

( * ) Notice: Subject to any disclaimer, the term of this patent is extended or adjusted under 35 U.S.C. 154(b) by 78 days.

(21) Appl. No.: 11/696,774

(22) Filed: Apr. 5, 2007

(65) Prior Publication Data

US 2008/0245846 A1    Oct. 9, 2008

(51) Int. Cl.
*B23K 31/00*  (2006.01)
*H01L 23/48*  (2006.01)

(52) U.S. Cl. .............. 228/179.1; 228/180.22; 257/777

(58) Field of Classification Search ............ 228/179.1, 228/180.22; 257/777
See application file for complete search history.

(56) References Cited

U.S. PATENT DOCUMENTS

| | | | |
|---|---|---|---|
| 3,312,878 A | | 4/1967 | Poch et al. |
| 4,418,857 A | * | 12/1983 | Ainslie et al. ............ 228/124.1 |
| 4,465,223 A | * | 8/1984 | Cammarano et al. ........ 228/198 |
| 4,967,950 A | * | 11/1990 | Legg et al. ............ 228/180.22 |
| 5,100,480 A | | 3/1992 | Hayafuju |
| 5,220,530 A | | 6/1993 | Itoh |
| 5,229,315 A | | 7/1993 | Jun et al. |
| 5,308,784 A | | 5/1994 | Kim et al. |
| 5,349,500 A | * | 9/1994 | Casson et al. ............... 361/749 |
| 5,399,898 A | * | 3/1995 | Rostoker ................... 257/499 |
| 5,563,084 A | | 10/1996 | Ramm et al. |
| 5,587,119 A | | 12/1996 | White |
| 5,608,264 A | | 3/1997 | Gaul |
| 5,708,569 A | | 1/1998 | Howard et al. |
| 5,780,776 A | | 7/1998 | Noda |
| 5,814,889 A | | 9/1998 | Gaul |
| 5,872,338 A | | 2/1999 | Lan et al. |
| 5,929,524 A | | 7/1999 | Drynan et al. |
| 5,962,922 A | | 10/1999 | Wang |
| 5,973,396 A | | 10/1999 | Farnworth |
| 6,037,665 A | | 3/2000 | Miyazaki |
| 6,075,710 A | | 6/2000 | Lau |
| 6,184,066 B1 | | 2/2001 | Chino et al. |
| 6,215,114 B1 | | 4/2001 | Yagi et al. |

(Continued)

FOREIGN PATENT DOCUMENTS

EP    0 516 866 A1    12/1992

(Continued)

OTHER PUBLICATIONS

International Search Report for PCT/US06/23364, dated Nov. 13, 2006.

(Continued)

*Primary Examiner*—Kevin P Kerns
*Assistant Examiner*—Devang R Patel

(57) ABSTRACT

A method of creating an electrical connection involves providing a pair of contacts each on one of two different chips, the pair of contacts defining a volume therebetween, the volume containing at least two compositions each having melting points, the compositions having been selected such that heating to a first temperature will cause a change in at least one of the at least two compositions such that the change will result in a new composition having a new composition melting point of a second temperature, greater than the first temperature and the melting point of at least a first of the at least two compositions, and heating the pair of contacts and the at least two compositions to the first temperature.

24 Claims, 6 Drawing Sheets

U.S. PATENT DOCUMENTS

| | | |
|---|---|---|
| 6,314,013 B1 | 11/2001 | Ahn et al. |
| 6,316,737 B1 | 11/2001 | Evans et al. |
| 6,498,089 B2 | 12/2002 | Komada |
| 6,559,540 B2 | 5/2003 | Kawashima |
| 6,577,013 B1 | 6/2003 | Glenn et al. |
| 6,590,278 B1 | 7/2003 | Behun et al. |
| 6,599,778 B2 | 7/2003 | Pogge et al. |
| 6,706,554 B2 | 3/2004 | Ogura |
| 6,740,576 B1 | 5/2004 | Lin et al. |
| 6,770,822 B2 | 8/2004 | Pasternak et al. |
| 6,939,789 B2 | 9/2005 | Huang et al. |
| 7,157,310 B2 | 1/2007 | Benson et al. |
| 7,400,042 B2 | 7/2008 | Eriksen et al. |
| 2001/0001292 A1 | 5/2001 | Bertin et al. |
| 2001/0033509 A1 | 10/2001 | Ahn et al. |
| 2001/0048166 A1 | 12/2001 | Miyazaki |
| 2002/0017399 A1 | 2/2002 | Chang et al. |
| 2002/0027441 A1 | 3/2002 | Akram et al. |
| 2002/0053726 A1 | 5/2002 | Mikubo et al. |
| 2002/0094675 A1 | 7/2002 | Kerr et al. |
| 2002/0102835 A1 | 8/2002 | Stucchi et al. |
| 2002/0127761 A1 | 9/2002 | Mottura et al. |
| 2002/0134581 A1 | 9/2002 | Figueroa et al. |
| 2003/0047799 A1 | 3/2003 | Cheever et al. |
| 2003/0052324 A1 | 3/2003 | Kimura |
| 2003/0080408 A1 | 5/2003 | Farnworth et al. |
| 2003/0085471 A1 | 5/2003 | Iijima et al. |
| 2003/0159262 A1 | 8/2003 | Pasternak et al. |
| 2003/0206680 A1 | 11/2003 | Bakir et al. |
| 2004/0051168 A1 | 3/2004 | Arai et al. |
| 2004/0124523 A1 | 7/2004 | Poo et al. |
| 2004/0207061 A1 | 10/2004 | Farrar et al. |
| 2004/0256686 A1 | 12/2004 | Sassolini et al. |
| 2004/0262635 A1 | 12/2004 | Lee |
| 2005/0006789 A1 | 1/2005 | Tomono et al. |
| 2005/0046034 A1 | 3/2005 | Farrar |
| 2005/0104027 A1 | 5/2005 | Lazarev |
| 2005/0104219 A1 | 5/2005 | Matsui |
| 2005/0121768 A1 | 6/2005 | Edelstein et al. |
| 2005/0133930 A1 | 6/2005 | Savastisuk et al. |
| 2005/0146049 A1 | 7/2005 | Kripesh et al. |
| 2006/0134832 A1 | 6/2006 | Iwasaki et al. |
| 2006/0278992 A1* | 12/2006 | Trezza et al. ............ 257/777 |

FOREIGN PATENT DOCUMENTS

| | | |
|---|---|---|
| EP | 0 757 386 A2 | 2/1997 |
| EP | 1 415 950 | 5/2004 |
| WO | WO 2006/074165 | 7/2006 |
| WO | WO 2006/138492 | 12/2006 |

OTHER PUBLICATIONS

International Search Report for PCT/US06/23366, dated Dec. 8, 2006.

International Search Report, PCT/US06/23297, dated Jan. 3, 2007.

International Search Report, PCT/US06/23249, dated Jun. 11, 2007.

Topol, A.W. et al., "Enabling Technologies for Wafer-Level Bonding of 3D MEMS and Integrated Circuit Structures", Electronic Components and Technology Conference, 2004, vol. 1, Jun. 1-4, 2004, pp. 931-938.

International Search Report and Written Opinion mailed on Dec. 12, 2008 in PCT/IB2008/001436.3

Jong-Hwan Park et al.; "Reaction Characteristices of the Au-Sn Solder with Under-Bump Metallurgy Layers in Optoelectronic Packages"; Journal of electronic Materials, vol. 31, No. 11, 2002, pp. 1175-1180.

J.Y. Tsai et al.; "Controlling microstructures from the Gold-Tin Reaction"; Journal of Electronic Materials; vol. 34., No. 2, 2005, pp. 182-187.

H.G. Song et al; "The Microstructure of Eutectic Au-Sn Solder Bumps on Cu/Electroless Ni/Au"; Journal of Electronic Materials, vol. 9, No. 9, 2001.

International Search Report and Written Opinion for PCT/IB08/001444, dated Mar. 23, 2009.

International Search Report and Written Opinion for PCT/IB2008/001444 mailed on Mar. 23, 2009.

Non-final Office Action for U.S. Appl. No. 11/696,796 mailed on May 13, 2009.

International Preliminary Report on Patentability for PCT/IB2008/001436 mailed Oct. 15, 2009.

International Preliminary Report on Patentability for PCT/IB2008/001444 mailed Oct. 15, 2009.

Final Office Action issued in U.S. Appl. No. 11/696,796 mailed on Oct. 22, 2009.

Notice of Allowance issued in U.S. Appl. No. 11/696,796 and mailed on Feb. 19, 2010.

* cited by examiner

HEAT CYCLE-ABLE CONNECTION

FIELD OF THE INVENTION

The present invention relates to semiconductors and, more particularly, to electrical connections for such devices.

CROSS REFERENCE TO RELATED APPLICATIONS

This application is related to a U.S. patent application entitled "Mobile Binding In An Electronic Connection" filed concurrently herewith, the entirety of which is incorporated by reference as if fully set forth herein.

BACKGROUND

When stacking chips, there are essentially two ways that chip to chip connections can be formed. One way, is to form the complete stack and then concurrently subject the entire stack to the conditions, such as heating and cooling, required to cause the electrically conductive bonding materials to establish the conductive path. The other way is to sequentially connect two components together, through heating and cooling of the connection points, and then sequentially attaching the next chip in the same manner, and so on, until the stack is complete.

The first, "concurrent" approach, has drawbacks because, in practice, it is difficult to maintain alignment among the stack components. In addition, it is difficult to ensure that all of the individual connections are each subjected to the appropriate conditions necessary to form reliable interconnections among the constituent components of the stack. Thus, there is a risk that any particular connection will not be made because the conditions near the connection were insufficient or detrimentally in excess of what was required.

The second, "sequential" approach, does not have the alignment problem. However, it still has drawbacks because the heat used to join each chip after the first can adversely affect the connections of previously joined chips.

Thus, there is a need for a better way of joining chips to form a stack that reduces or eliminates the problems that can be encountered by using conventional concurrent or sequential joining techniques.

SUMMARY OF THE INVENTION

We have devised an approach that allows a stack of chips to be created (on a chip, die or wafer basis) through a sequential approach or a concurrent approach that does not suffer from the problems noted above.

One aspect involves a method of creating an electrical connection. The method involves providing a pair of contacts each on one of two different chips, the pair of contacts defining a volume therebetween, the volume containing at least two compositions each having melting points, the compositions having been selected such that heating to a first temperature will cause a change in at least one of the at least two compositions such that the change will result in a new composition having a new composition melting point of a second temperature, greater than the first temperature and the melting point of at least a first of the at least two compositions, and heating the pair of contacts and the at least two compositions to the first temperature.

Another aspect involves a stack of chips. The stack of chips has a first set of paired contacts electrically joining two chips together using a first material composition having a first melting point, and a set of contacts on one of the two chips including thereon a bonding constituent composition having a second melting point that is lower than the first melting point, so that when the set of contacts is mated with a corresponding set of contacts on a third chip and the set of contacts and corresponding set of contacts are heated, to a temperature between temperatures corresponding to the first and second melting points, the bonding constituent composition will become the first material composition.

A further aspect involves a method performed on an electrical contact. The method involves heating at least two conductive materials located at a connection point to a first temperature, the first temperature being in excess of a temperature needed to cause at least some of a first of the at least two conductive materials to change to a state having a higher melting point than a melting point of the first of the at least two conductive materials, but lower than a liquidus temperature corresponding to a liquidus state on a state diagram for the first of the at least two conductive materials, and allowing the connection point to cool to below the temperature needed to cause the at least some of the first of the at least two conductive materials to change to the state having the higher melting point.

The advantages and features described herein are a few of the many advantages and features available from representative embodiments and are presented only to assist in understanding the invention. It should be understood that they are not to be considered limitations on the invention as defined by the claims, or limitations on equivalents to the claims. For instance, some of these advantages are mutually contradictory, in that they cannot be simultaneously present in a single embodiment. Similarly, some advantages are applicable to one aspect of the invention, and inapplicable to others. Thus, this summary of features and advantages should not be considered dispositive in determining equivalence. Additional features and advantages of the invention will become apparent in the following description, from the drawings, and from the claims.

DETAILED DESCRIPTION

Figure 1:
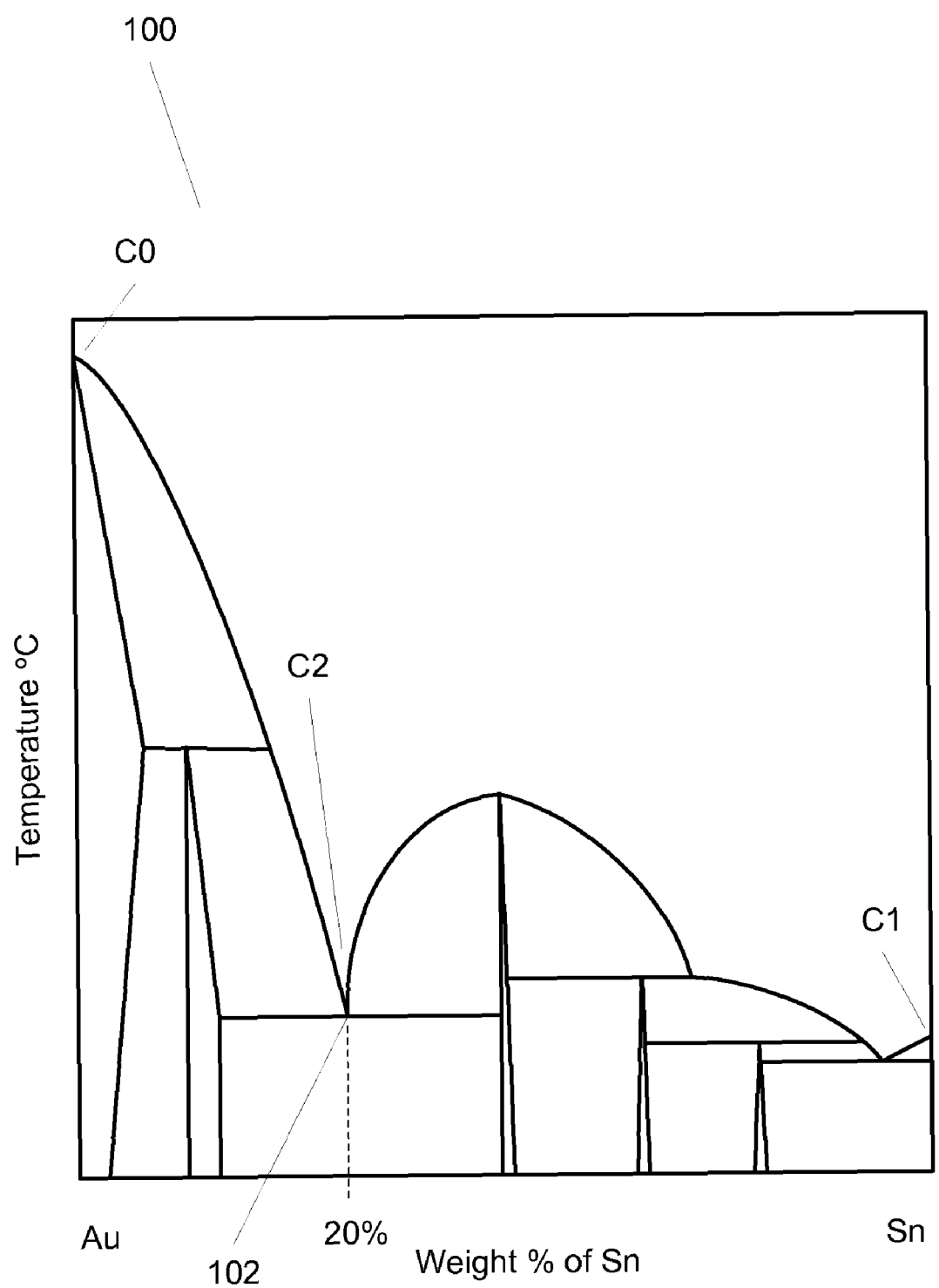
FIG. 1 is a representation of the phase diagram for binary alloys of gold and tin.

U.S. patent applications, Ser. Nos. 11/329,481, 11/329,506, 11/329,539, 11/329,540, 11/329,556, 11/329,557, 11/329,558, 11/329,574, 11/329,575, 11/329,576, 11/329,873, 11/329,874, 11/329,875, 11/329,883, 11/329,885, 11/329,886, 11/329,887, 11/329,952, 11/329,953, 11/329,955, 11/330,011 and 11/422,551, incorporated herein by reference describe various techniques for forming small, deep vias in, and electrical contacts for, semiconductor wafers. These techniques allow for via densities and placement that was previously unachievable and can be performed on a chip, die or wafer scale.

The techniques described therein are, as described, particularly well suited for use in creating very compact stacks of chips. Moreover, those techniques can involve use of a "tack & fuse" process that provides further advantages independent of many of the techniques described therein.

In addition, U.S. patent application entitled "Mobile Binding In An Electronic Connection" filed concurrently herewith and incorporated herein by reference, describes ways to reduce or eliminate the problem of phase segregation in connections. As will become apparent, that approach is completely compatible with the techniques described herein and, in doing so, further advantages can be achieved that are not obtained with either one by themselves.

Specifically, we have devised a further improvement to those techniques that allows a stack of chips to be created (on a chip, die or wafer basis) through a sequential approach or a concurrent approach that does not suffer from the problems noted above. In addition, in some implementations, we take advantage of the use of specific barriers with specific bonding materials to prevent mobile atoms from creating phase segregation or voids. This is accomplished by specifically selecting bonding materials used, based upon the temperature at which the bonding materials flow, to allow multiple high-temperature processing steps to occur without detrimentally affecting any previously formed connections.

This can be accomplished in different ways. However, in general the approach involves selecting the particular materials that will be part of the electrical connection formation (whether they are pure, substantially pure or alloyed metals) such that the initial formation of an electrically conductive connection will occur at about a particular temperature "T1". However, as a result of that formation, the materials that form the conductive connection will change into a composition that has a higher melting point than that of the original materials. As a result, a subsequent connection that is created using the same materials will not cause the original connection to begin to liquify (or if the new melting point is higher than T1, but very close to T1, such that no minimally present original materials appreciably liquify).

Optionally, the materials can have been selected so that subsequent elevation to a higher temperature "T2" will cause a further change into a composition with yet a higher melting point. In this manner, subsequent elevations in temperature to T1 will have no effect at all.

Advantageously, this approach is particularly useful in conjunction with a tack & fuse connection process, because it already involves a lower temperature "tack" phase and a subsequent higher temperature "fuse" phase.

Figure 2:
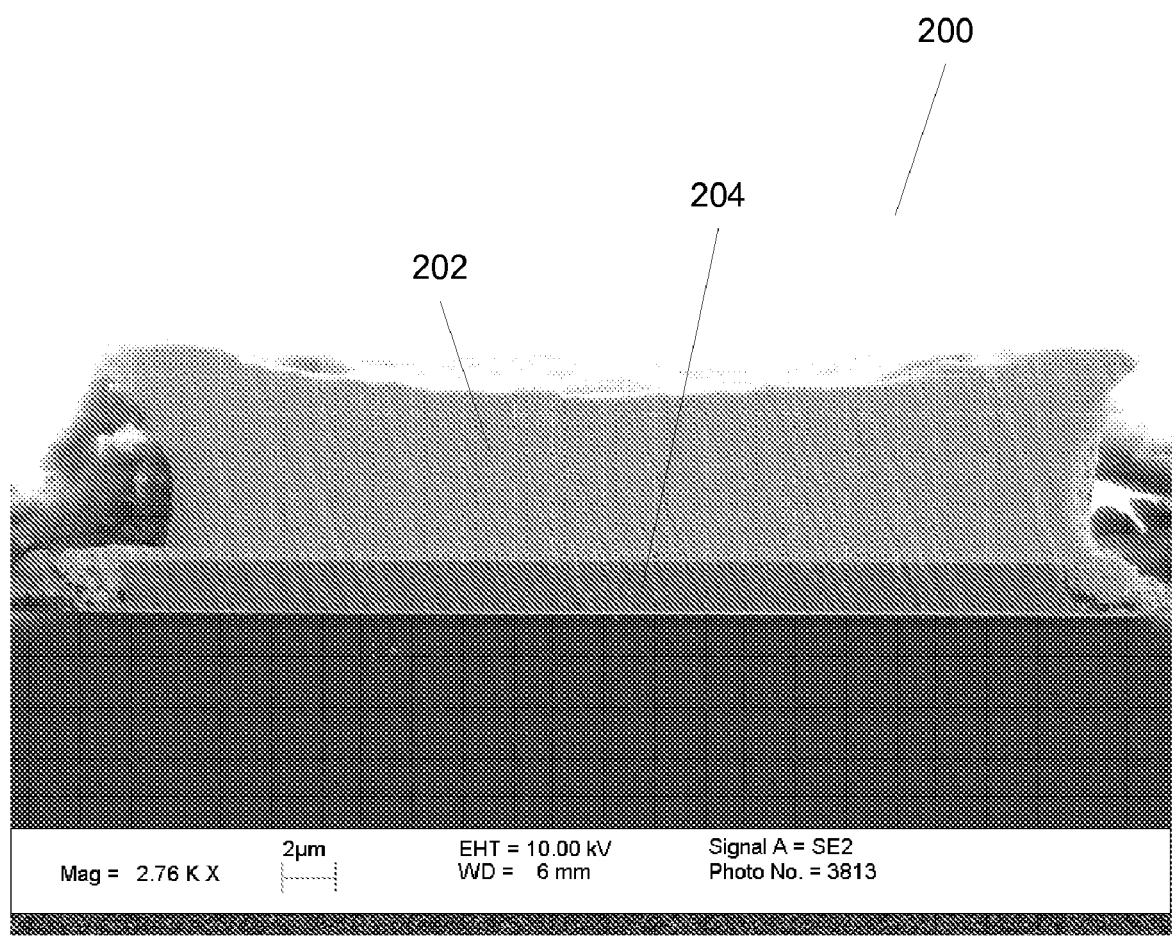
FIG. 2 is a cross sectional photograph of a contact 200 according to a variant of the approaches described herein.
Figure 3:
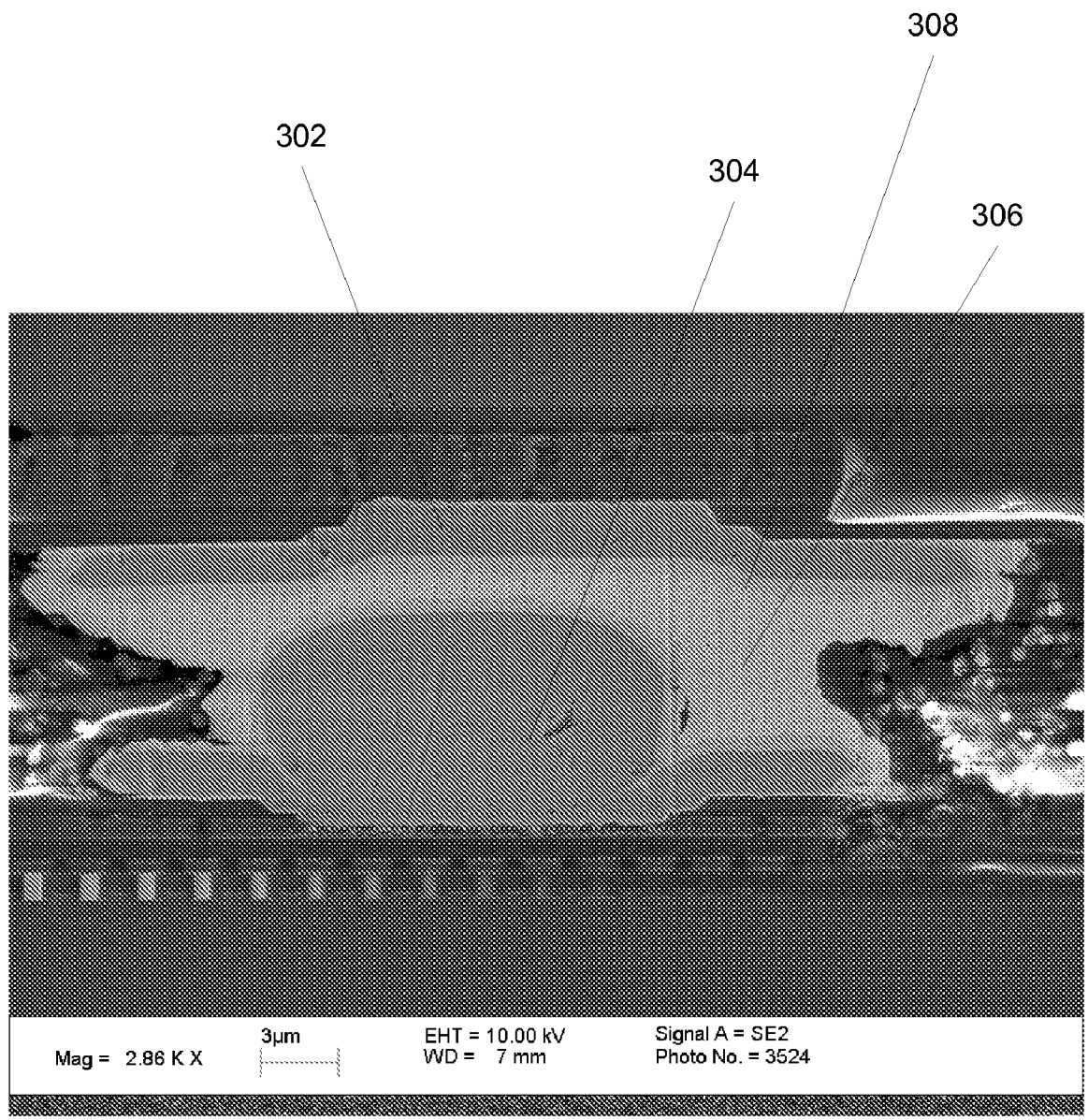
FIG. 3 is a cross sectional photograph of a similar original composition contact, such as shown in FIG. 2, after it has been joined to a mating contact.

One example of this approach is illustrated with respect to FIG. 1 through FIG. 3.

In this example, an alloy is deposited on a contact. In this example, the deposited alloy is an alloy of gold and tin, specifically, 80% Au and 20% Sn. FIG. 1 is a representation of the phase diagram 100 for binary alloys of gold and tin (although not precisely shown to scale). As can be seen this 80/20 AuSn alloy is at a eutectic point 102 of the phase diagram 100. This eutectic point 102 represents the lowest melting point of this composition alloy. However, as the alloy is taken to a higher temperature the alloy interacts with some other material that is present, for example, the contact material or, preferably, a material that was deposited either i) between the contact and the alloy, or ii) on top of the alloy, to cause a compositional change of the alloy. Depending upon the interaction and materials, this compositional change will cause movement to the right or left on the phase diagram based upon which of the weight percentage component concentrations decrease or increase. As long as the composition does not cause a shift on the phase diagram to a composition of lower melting point, the result is a composition that has a higher melting point than the starting composition.

Depending upon the particular implementation, this left or right movement on the phase diagram can be the result of addition of one of the constituent components, removal of one of the constituent components, or addition of one or more other components.

By way of one example, a pure tin or high tin concentration gold-tin layer could have been deposited on top of the alloy. Thus, when the melting temperature of the main gold-tin alloy was reached, the additional tin or gold-tin alloy will also have melted and combined with the 80/20 alloy to form a new concentration that was higher in tin, for example a 70/30 gold-tin alloy. This concentration is to the right of the original composition and thus, has a higher melting point than the 80/20 alloy.

Alternatively, a material could have been used that would draw tin out of the gold-tin alloy and itself alloy with the tin leaving a higher concentration of gold, for example. This would result in leftward movement on the phase diagram due to the higher concentration of gold and, hence, a higher melting point for the resultant alloy.

In the case of the 80/20 gold-tin alloy, looking at the phase diagram, to achieve the desired result, the compositional change could be one that added tin or removed gold to cause rightward compositional movement on the phase diagram or removed tin or added gold to cause leftward compositional movement on the phase diagram.

In another similar alternative, a material could be used that will alloy with both the gold and tin to itself create a small amount of ternary alloy and, as long as the composition of the main alloy changed such that it had a higher melting point, the same effect would be achieved.

By way of a similar example with reference to FIG. 2 and FIG. 3 presume that the same approach and materials as above were used (i.e. 80/20 Au—Sn), but a sufficient volume of nickel was deposited, for example, under the alloy as a barrier between the alloy and the contact, or on top of the alloy as a cap. FIG. 2 is a cross sectional photograph of a contact 200 according to a variant of the approaches described herein having a connection material 202 (the 80/20 Au—Sn alloy) deposited on top of the barrier material 204 (the Ni barrier). In such a case, at an elevated temperature of or above about 300° C., the materials will diffuse to some extent. The result will be that tin atoms will be absorbed by, or alloy with, the Ni layer leaving behind a Au—Sn alloy composition with a high percentage of the lower mobility species (in this case gold) while the nickel has trapped some of the higher mobility tin and absorbed the remainder of it.

FIG. 3 is a cross sectional photograph of a similar original composition contact 302, such as shown in FIG. 2, after it has been joined to a mating contact 304 at an elevated temperature, as discussed above, to form an electrically conductive connection between the two contacts 302, 304. In FIG. 3, as a result of the above approach, the new composition within the volume between the contact pair 302, 304 is far from the original 80/20 percent ratio. Some areas 306 have 97% gold while some areas 308 have 25% tin. As a result, from the phase diagram 100 of FIG. 1, it should be evident that the melting point of the various resulting materials has changed dramatically. Moreover, due to the fact that a substantial part of the contact is now more than 95% gold, the majority of the contact will have a melting point closer to 1000° C. than to 300° C. Even those regions with higher tin concentrations will have melting points closer to 400° C. than 300° C.

Still further, and advantageously, the addition of nickel into the compositional mix makes the tin less likely to be mobile. This means that the likelihood of a phase segregation problem is a reduced.

Advantageously, in addition, the absorption or alloying of the tin prevents the entire mix from becoming self-centering, what we and the above-incorporated applications call a "liquidous" or "liquidus" state which is different from the liquidus state referred to in a phase.

Note, however, that it is possible for the connections of some implementations to soften to something less that a liquidus state on a phase diagram (i.e. the melting point) for the material or some component thereof, for example, with a post and penetration connection approach, the "malleable" material may need to be at an elevated temperature to allow the material to soften sufficiently to allow the post to penetrate but not soften to the "liquidus" state as we have defined it, let alone to a molten state.

As a result, the contact can be raised up to the original melting point over and over again without having any effect on this connection. Thus, it should be appreciated that this approach could be used over and over to add chips to a stack without concern that the forming of the new connections will disrupt the prior connections.

Of course, it should now be appreciated that the starting composition need not be one at the lowest melting point, so long as the compositional change results in an upwards shift in melting point. This can be seen from the following example where the materials start off segregated and then combine into a final state.

Figure 4:
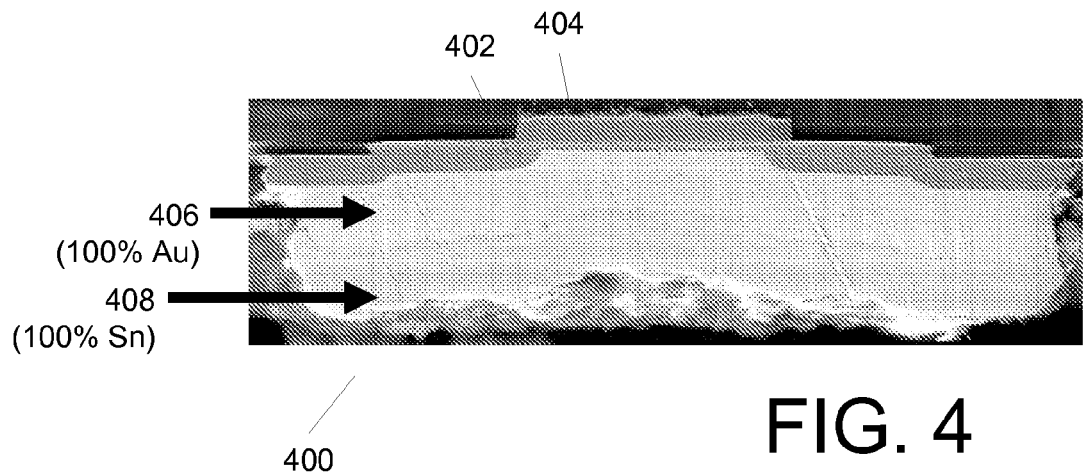
FIG. 4 is a cross sectional photograph of a contact.

FIG. 4 is a cross sectional photograph of a contact 400 according to one variant that is made up of a barrier 402, in this case nickel, on top of a device pad 404 covered by a layer 406 of 100% gold which, in turn, is covered by a layer 408 of 100% tin.

A contact like that of FIG. 4 will be joined to another contact (not shown in FIG. 4) to form an electrical connection. In this example, the other contact will be a post that is covered by a layer of nickel.

Figure 5:
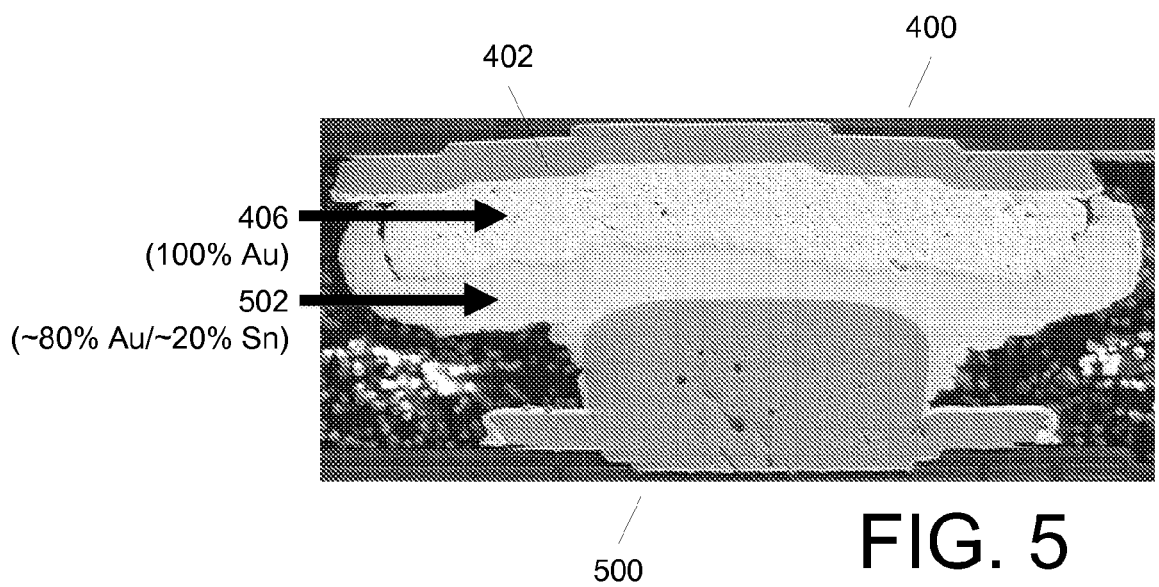
FIG. 5 is a cross sectional photograph of a contact like from FIG. 4 after it has been joined to another contact.

FIG. 5 is a cross sectional photograph of a contact 400 like from FIG. 4 after it has been joined to the other contact 500 in a tack phase of a tack & fuse process.

Heating of the contact has caused the layer 408 of tin, with its lower melting point, to diffuses into the layer 406 of gold and through to the barrier 402 of nickel. This changes the compositions so that there is still a layer 406 with a substantial amount of about 100% gold, but there is also now an alloy layer 502 of about 80% gold and 20% tin instead of the original 100% tin layer. Thus, whereas the original compositions were located at points "C0" and "C1" on the phase diagram of FIG. 1, the gold layer is still at about point "C0", but the new composition is now located at point "C2" on the phase diagram of FIG. 1 so that, in the case of the tin to tin-alloy change, the melting point has gone up from about 232° C. to about 282° C. and the melting point of the gold has essentially not changed. (Of course in actuality, the composition of the gold might now be slightly less than 100%, thereby slightly lowering the melting point, but it would be an insubstantial change because the meaningful temperature would be between about 232° C. and about 282° C.). Referring back to FIG. 5, if that contact pair 400, 500 was subjected to the appropriate higher temperature, for example through use of a fuse phase of a tack & fuse process, a further compositional change would occur.

Figure 6:
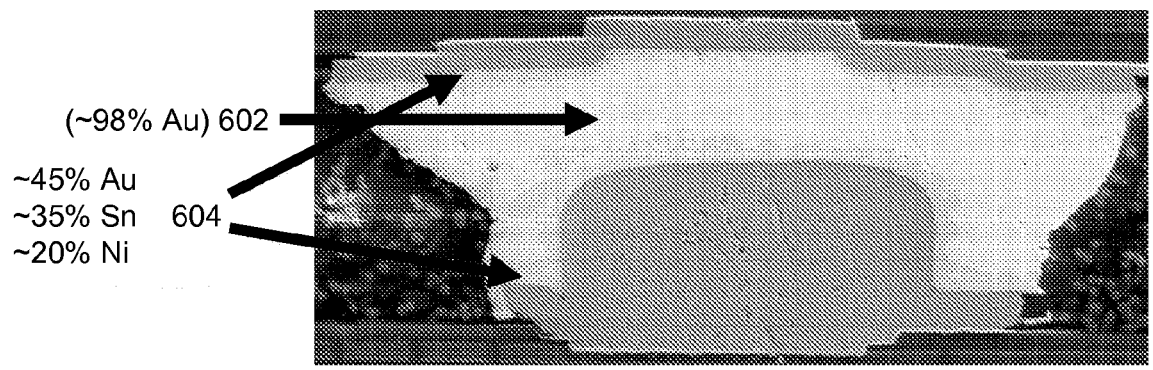
FIG. 6 is a cross sectional photograph of a contact like from FIG. 5 after completion of an elevated temperature exposure.

FIG. 6 is a cross sectional photograph of a contact like from FIG. 5 after completion of a process of elevated temperature exposure, by way of example, a fuse process. As can be seen in FIG. 6, the final composition of the connection is now a mostly gold (about 98%) center area 602 flanked by a ternary alloy 604 of gold, tin and nickel, in this example, of approximately 45% Au, 35% Sn and 20% Ni. Since this alloy 604 has a higher melting point than the 80%/20% gold-tin alloy, the same effect described above has been obtained. Thus, this contact could be subjected to heat cycling up to the temperature that caused this ternary alloy 604 to form, without the risk of this connection being disrupted because the component melting points are all above that temperature.

At this point it is worth noting that the above approach is not limited to use with pure metals or alloys. The same approach can be used for solders (whether they include lead or are lead free).

Figure 7:
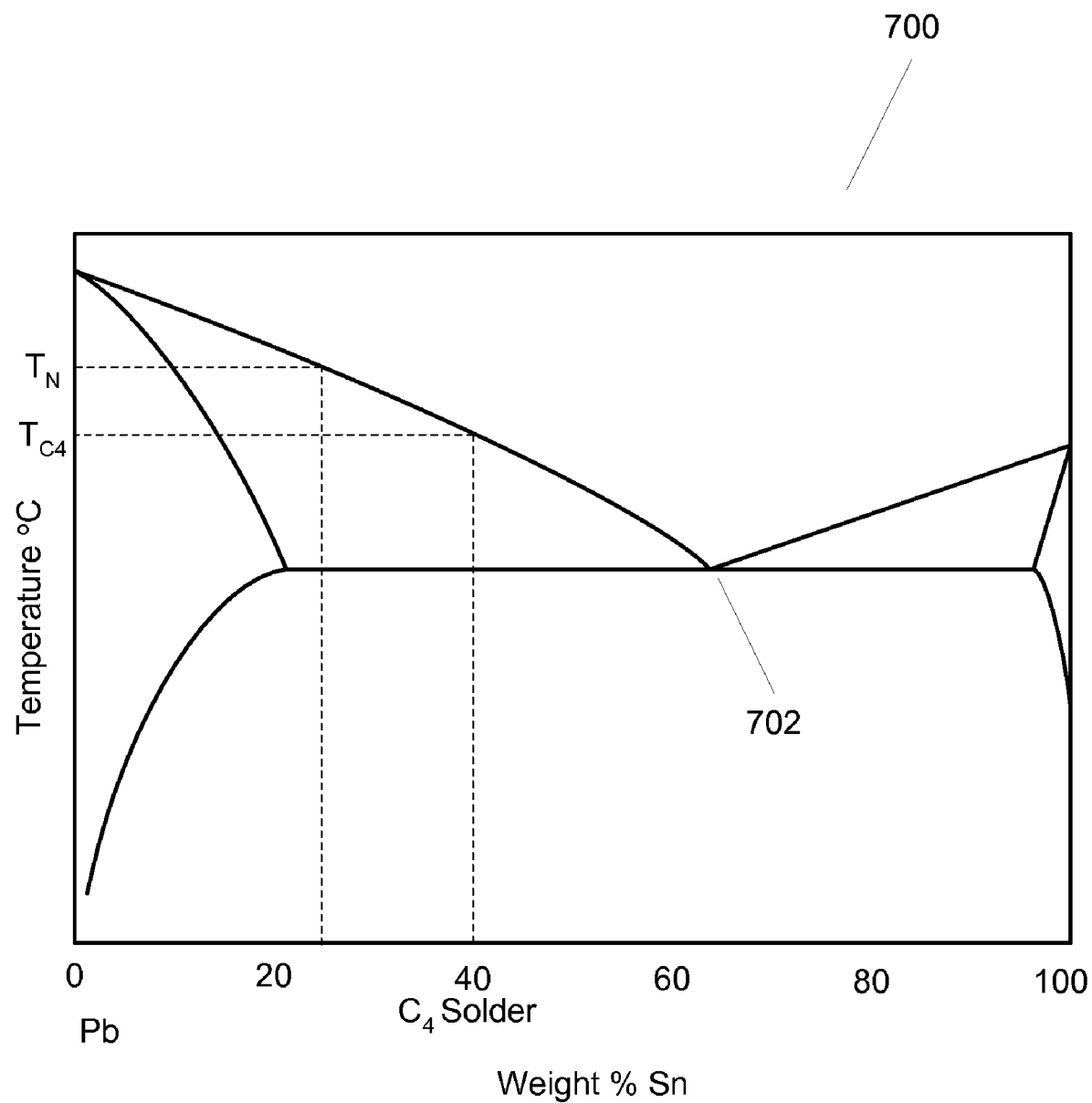
FIG. 7 is a representation of the phase diagram for binary alloys of Pb and Sn.
Figure 8:
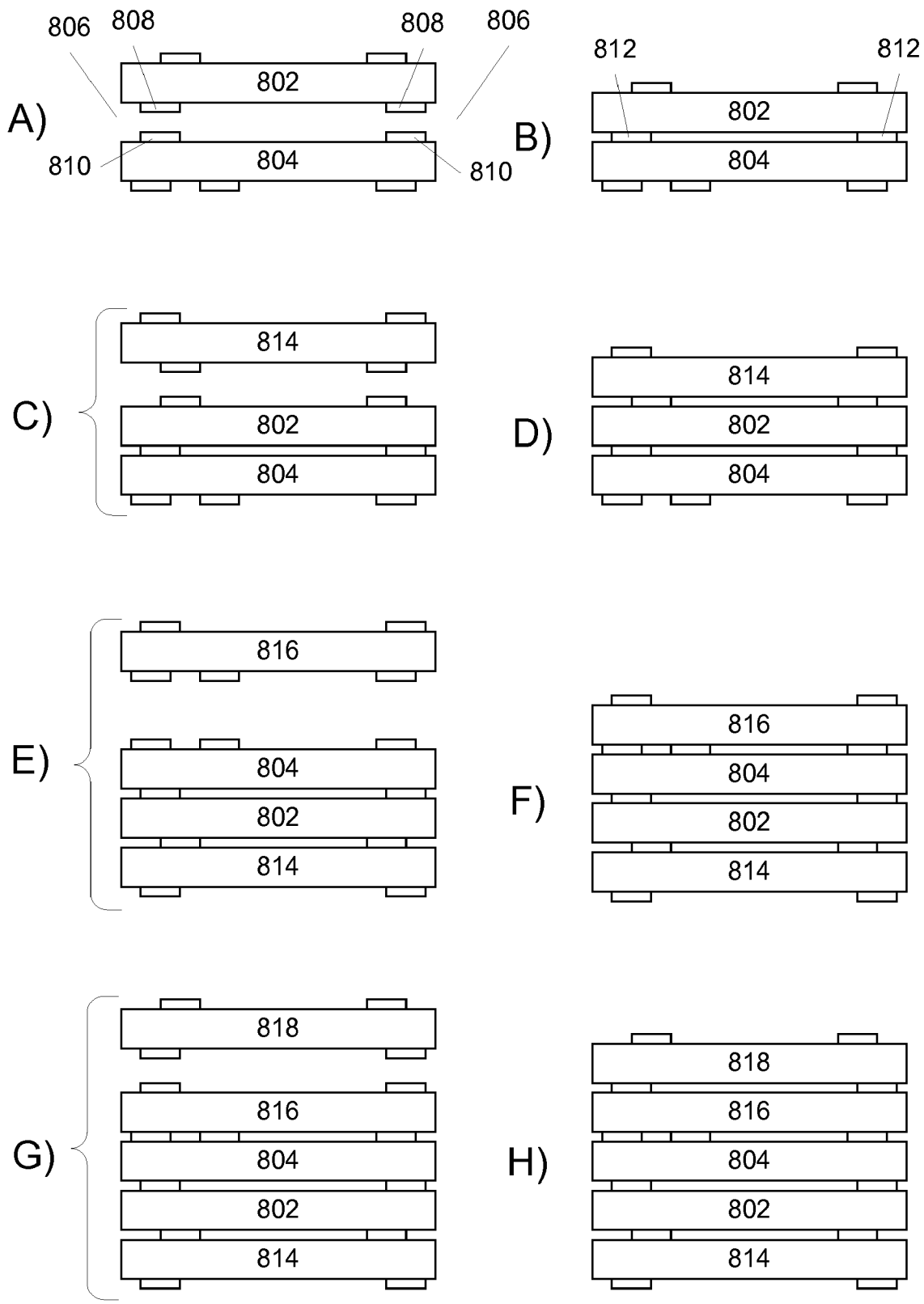
FIG. 8A through FIG. 8H, which illustrate stack creation using a variant of the above approaches.

FIG. 7 is a representation of the phase diagram 700 for binary alloys of lead and tin (although not precisely shown to scale). Bearing the above description and examples in mind, one can now see that if an initial composition coinciding with the eutectic point 702 is used and an additional composition is used to either add lead or remove tin, the melting point will go up as the composition moves to the left side of the phase diagram. Alternatively, with that same starting point 702, if an additional composition can is used to either remove lead or add tin, the melting point will still go up by virtue of the composition moving to the right side of the phase diagram 700.

It should now be appreciated that the same approach can advantageously even be used with conventional C4 solder which, as indicated on the phase diagram, has approximately a 60% Pb/40% Sn composition. To do so, as it should now be evident, an additional composition is used that will remove tin or add lead to the C4 solder upon heating. In this manner, the compositional change will result in a point to the left of the composition of C4 solder and, consequently a higher melting point. If one presumes that this is done for a connection and the resulting composition is 25% tin and 75% lead, the melting point will have gone up from the temperature TC4 to the temperature corresponding to the point on the phase diagram labeled "TN". Thereafter, the temperature of the connection can go up to and above the C4 melting point and, as long as it does not exceed the TN point temperature, the connection will not be disturbed.

Now, it can be appreciated that, by using a variant of this approach, a stack 800 of chips can be easily created in a sequential manner as follows. This process is illustrated, in overly simplified form, in FIG. 8A through FIG. 8H, which illustrate stack creation using a variant of the above approaches.

Using a connection such as described above, two chips 802, 804 for the stack (whether still part of a wafer or after separation) (FIG. 8A) are brought together (FIG. 8B) and the temperature at the connection points 806 are raised to above the melting point of one of the two components 808, 810 of the connections which contain one variant of materials suitable for the approach described herein. This will cause an electrical connection to be formed at each of the connection points 806 and also change the composition of the electrically conductive bonding material to a new composition 812 that will have a higher melting point than the temperature used to create the composition. Then, the joined chips 802, 804 can be cooled to a temperature below the connection forming temperature to cause the connection to "set." Thereafter, a further chip 814 can be brought to the now formed stack (FIG. 8C), its contacts (which also use a variant as described herein, and ideally the same variant used for joining the first two chips) can be brought into contact with mating contacts on the stack at their respective connection points. A subsequent raising of the temperature at these connection points to the connection forming temperature will cause the third chip to be connected to the stack (FIG. 8D) but, owing to the higher melting point of the composition created by the joining process, the connections between the first two chips will not be affected. This process can be repeated again (FIG. 8E, FIG. 8F) and again (FIG. 8G, FIG. 8H), as many times as necessary to create the stack.

It should thus be understood that this description (including the figures) is only representative of some illustrative embodiments. For the convenience of the reader, the above description has focused on a representative sample of all possible embodiments, a sample that teaches the principles of the invention. The description has not attempted to exhaustively enumerate all possible variations. That alternate embodiments may not have been presented for a specific portion of the invention, or that further undescribed alternate embodiments may be available for a portion, is not to be considered a disclaimer of those alternate embodiments. One of ordinary skill will appreciate that many of those undescribed embodiments incorporate the same principles of the invention and others are equivalent.

What is claimed is:

1. A method of forming an electrical connection between a first electrical contact on a first chip and a second electrical contact on a second chip, the method comprising:
   bringing the first and second electrical contacts proximate each other, wherein the first electrical contact includes a first composition having a first melting point, and wherein the second electrical contact includes a second composition having a second melting point;
   inserting one of the first or second electrical contacts into the other one of the first or second electrical contacts at a temperature below the first and second melting points; and
   heating the first and second electrical contacts to a first temperature to form an electrical connection between them having a third composition, wherein the third composition has a third melting point that is greater than the first and second melting points, and wherein said heating the first and second electrical contacts to a first temperature is performed after said inserting one of the first or second electrical contacts into the other one of the first or second electrical contacts.

2. The method of claim 1, further comprising heating one of the first or second electrical contacts to the temperature below the first and second melting points.

3. The method of claim 2, wherein the first and second electrical contacts collectively include a rigid portion and a malleable portion, and wherein said inserting comprises penetrating the rigid portion into the malleable portion.

4. The method of claim 3, wherein said heating one of the first or second electrical contacts comprises heating the malleable portion to soften the malleable material so that the rigid portion can cause the malleable portion to deform under a pressure, thereby penetrating into the malleable portion.

5. The method of claim 1, further comprising, after said heating, cooling the first and second electrical contacts to a temperature below the first temperature.

6. The method of claim 5, further comprising, following said cooling:
   bringing a third electrical contact on a third chip proximate to a mating electrical contact on one of the first or second chips;
   heating the third electrical contact and the mating electrical contact to a temperature that is at least the first temperature but less than the third melting point; and
   following said heating the third electrical contact and the mating electrical contact, cooling the third electrical contact and the mating electrical contact to a temperature below the first temperature.

7. The method of claim 1, further comprising providing a barrier material between the first and second electrical contacts.

8. The method of claim 1, further comprising providing a material between the first and second electrical contacts, wherein the material, when heated above the first temperature, will alloy with one of the first or second compositions.

9. The method of claim 1, wherein the first and second compositions are arranged in a layered configuration, and wherein the third melting point is greater than the first temperature.

10. A method of forming an electrical connection between a first electrical contact and a second electrical contact, wherein one of the first or second electrical contact has a connection point including both a first conductive material and a second conductive material, the method comprising:
    applying a pressure to insert one of the first or second electrical contacts into the other one of the first or second electrical contacts;
    heating the first and second conductive materials to a first temperature, wherein the first temperature is sufficient to cause at least some of the first conductive material to change composition and have a higher melting point than a melting point of the first conductive material in its initial composition, but wherein the first temperature is lower than a liquidus temperature for the first conductive material, and wherein said heating the first and second conductive materials to a first temperature is performed after said applying a pressure to insert one of the first or second electrical contacts into the other one of the first or second electrical contacts; and
    allowing the connection point to cool to below the first temperature.

11. The method of claim 10, wherein the first and second electrical contacts collectively include a rigid portion and a malleable portion, and wherein said applying a pressure to at least one of the first or second electrical contacts causes the rigid portion to penetrate into the malleable portion.

12. The method of claim 10, further comprising disposing an alloy on at least one of the first or second electrical contacts before said joining the first and second electrical contacts.

13. The method of claim 12, further comprising providing a barrier material between the first and second electrical contacts, wherein the barrier material is configured to bind with a mobile component from one of the alloy, the first electrical contact, or the second electrical contact.

14. The method of claim 13, wherein the barrier material comprises nickel, and wherein the mobile component comprises tin.

15. The method of claim 10, further comprising, following said allowing the connection point to cool, heating the connection point to a reheat temperature that is above the first temperature but below the liquidus temperature.

16. A method of electrically connecting a plurality of chips, wherein the plurality of chips include a first chip having a first electrical contact and a second chip having a second electrical contact, and wherein the first and second electrical contacts include a first composition having a first melting point and a second composition having a second melting point, the method comprising:

applying a pressure to one of the first or second chips to join the first and second electrical contacts by inserting one of the first or second electrical contacts into the other one of the first or second electrical contacts; and heating the first and second electrical contacts to a first temperature to form an electrical connection having a third composition, wherein the third composition has a third melting point greater than at least one of the first or second melting points and greater than the first temperature, and wherein said heating the first and second electrical contacts to a first temperature is performed after said applying a pressure to one of the first or second chips to join the first and second electrical contacts.

17. The method of claim 16, wherein one of the first or second electrical contacts includes a rigid portion and the other one of the first or second electrical contacts includes a malleable portion, and wherein said applying a pressure causes the malleable portion to deform, thereby allowing the rigid portion to penetrate into the malleable portion.

18. The method of claim 16, wherein the first composition comprises an alloy, and wherein the second composition comprises a substantially pure metal.

19. The method of claim 18, wherein the alloy comprises gold and tin, and wherein the substantially pure metal comprises tin.

20. The method of claim 19, wherein the alloy comprises approximately 80 percent gold and 20 percent tin.

21. The method of claim 20, wherein the third composition comprises approximately 70 percent gold and 30 percent tin.

22. The method of claim 16, further comprising providing a barrier layer between the first and second electrical contacts, wherein the barrier layer comprises nickel.

23. The method of claim 22, wherein the first temperature is about 300 degrees Celsius.

24. The method of claim 16, wherein the plurality of chips further comprise a third chip having a third electrical contact, the method further comprising:

providing the third electrical contact proximate a corresponding mating electrical contact on one of the first or second chips; and heating the third electrical contact and the corresponding mating electrical contact to the first temperature to form an electrical connection between the third chip and one of the first or second chips.

* * * * *

UNITED STATES PATENT AND TRADEMARK OFFICE
CERTIFICATE OF CORRECTION

PATENT NO. : 7,850,060 B2  
APPLICATION NO. : 11/696774  
DATED : December 14, 2010  
INVENTOR(S) : Trezza et al.

It is certified that error appears in the above-identified patent and that said Letters Patent is hereby corrected as shown below:

Title Page 2, item (56), under "Other Publications", in Column 2, Line 10, delete "PCT/IB2008/001436.3" and insert -- PCT/IB2008/001436. --.

Title Page 2, item (56), under "Other Publications", in Column 2, Line 11, delete "Characteristices" and insert -- Characteristics --.

Signed and Sealed this  
Nineteenth Day of April, 2011

David J. Kappos  
*Director of the United States Patent and Trademark Office*